United States Patent
Cheng et al.

(10) Patent No.: US 11,688,789 B2
(45) Date of Patent: *Jun. 27, 2023

(54) SEMICONDUCTOR DEVICE WITH REDUCED FLICKER NOISE

(71) Applicant: Taiwan Semiconductor Manufacturing Co., Ltd., Hsin-Chu (TW)

(72) Inventors: Hsin-Li Cheng, Hsin Chu (TW); Liang-Tai Kuo, Zhudong Township (TW); Yu-Chi Chang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 147 days.

This patent is subject to a terminal disclaimer.

(21) Appl. No.: 17/198,626

(22) Filed: Mar. 11, 2021

(65) Prior Publication Data

US 2021/0202711 A1 Jul. 1, 2021

Related U.S. Application Data

(60) Continuation of application No. 16/732,397, filed on Jan. 2, 2020, now Pat. No. 10,971,596, which is a
(Continued)

(51) Int. Cl.
*H01L 29/66* (2006.01)
*H01L 29/51* (2006.01)
(Continued)

(52) U.S. Cl.
CPC ...... *H01L 29/513* (2013.01); *H01L 21/31155* (2013.01); *H01L 21/324* (2013.01); *H01L 29/6656* (2013.01); *H01L 29/66492* (2013.01)

(58) Field of Classification Search
CPC .......... H01L 29/66492; H01L 29/6656; H01L 21/823437; H01L 21/823468
See application file for complete search history.

(56) References Cited

U.S. PATENT DOCUMENTS

| 9,240,497 | B2 | 1/2016 | Ning et al. |
| 10,529,818 | B1 | 1/2020 | Cheng et al. |

(Continued)

OTHER PUBLICATIONS

Non-Final Office Action dated Sep. 17, 2019 for U.S. Appl. No. 16/117,166.
(Continued)

*Primary Examiner* — Mark V Prenty
(74) *Attorney, Agent, or Firm* — Eschweiler & Potashnik, LLC (57) ABSTRACT

In some embodiments, a semiconductor device is provided. The semiconductor device includes a source region and a drain region arranged in a semiconductor substrate, where the source region is laterally separated from the drain region. A gate stack is arranged over the semiconductor substrate and between the source region and the drain region. A cap layer is arranged over the gate stack, where a bottom surface of the cap layer contacts a top surface of the gate stack. Sidewall spacers are arranged along sides of the gate stack and the cap layer. A resist protective oxide (RPO) layer is disposed over the cap layer, where the RPO layer extends along sides of the sidewalls spacers to the semiconductor substrate. A contact etch stop layer is arranged over the RPO layer, the source region, and the drain region.

20 Claims, 9 Drawing Sheets

Related U.S. Application Data division of application No. 16/117,166, filed on Aug. 30, 2018, now Pat. No. 10,529,818.

(60) Provisional application No. 62/703,636, filed on Jul. 26, 2018.

(51) Int. Cl.
*H01L 21/3115* (2006.01)
*H01L 21/324* (2006.01)

(56) References Cited

U.S. PATENT DOCUMENTS

| | | |
|---|---|---|
| 10,971,596 B2 * | 4/2021 | Cheng .................. H01L 21/324 |
| 2012/0115270 A1 | 5/2012 | Arakawa |
| 2015/0123178 A1 | 5/2015 | Nishida et al. |
| 2015/0249107 A1 | 9/2015 | Baba et al. |
| 2017/0084620 A1 | 3/2017 | Wu et al. |

OTHER PUBLICATIONS

Notice of Allowance dated Nov. 20, 2019 for U.S. Appl. No. 16/117,166.
Notice of Allowance dated Dec. 3, 2020 for U.S. Appl. 16/732,397.

* cited by examiner

SEMICONDUCTOR DEVICE WITH REDUCED FLICKER NOISE

REFERENCE TO RELATED APPLICATIONS

This application is a Continuation of U.S. application Ser. No. 16/732,397, filed on Jan. 2, 2020, which is a Divisional of U.S. application Ser. No. 16/117,166, filed on Aug. 30, 2018 (now U.S. Pat. No. 10,529,818, issued on Jan. 7, 2020), which claims the benefit of U.S. Provisional Application No. 62/703,636, filed on Jul. 26, 2018. The contents of the above-referenced patent applications are hereby incorporated by reference in their entirety.

BACKGROUND

Semiconductor devices are electronic components that exploit electronic properties of semiconductor materials to affect electrons or their associated fields. A widely used type of semiconductor device is a field-effect transistor (FET). A FET comprises a pair of source/drain regions, a selectively-conductive channel, and a gate electrode. FETs are versatile devices that may be used for, among other things, switches, amplifiers, and memory. Examples of FETs include metal-oxide-semiconductor field-effect transistors (MOSFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some metal-oxide-semiconductor field-effect transistors (MOSFETs) comprise a semiconductor substrate and a shallow trench isolation (STI) structure. The STI structure is disposed in the semiconductor substrate and demarcates a device region of the semiconductor substrate. Further, the MOSFET comprises a pair of source/drain regions, a selectively-conductive channel, a gate dielectric, and a gate electrode. The source/drain regions are disposed in the semiconductor substrate and laterally spaced in the device region. The selectively-conductive channel is disposed in the device region of the semiconductor substrate and extends laterally from one of the source/drain regions to another one of the source/drain regions. The gate dielectric layer and the gate electrode are arranged between the source/drain regions and are disposed over the selectively-conductive channel.

A challenge with the above MOSFET is flicker noise. Flicker noise is a type of electronic noise with a 1/f, or "pink," power spectral density. One source of flicker noise occurs near a central portion of the selectively-conductive channel and is attributed to charge carriers being trapped and de-trapped by defect states at an interface between the gate dielectric layer and the selectively-conductive channel. Due to defect states along the interface of the gate dielectric layer and the selectively-conductive channel, the gate dielectric layer comprises traps that may cause carrier generation to occur and may cause unwanted fluctuations in the conductance of the selectively-conductive channel.

Another source of flicker noise occurs near a peripheral portion of the selectively-conductive channel and is attributed to charge carriers being trapped and de-trapped at STI corners at an interface between the STI structure and the selectively-conductive channel. The STI corners are top cross-sectional corners of the semiconductor substrate that are on opposite sides of the selectively-conductive channel and that border the STI structure in the device region of the semiconductor substrate. Due to defect states along STI corners, the STI corners may also contribute to unwanted fluctuation in the conductance of the selectively-conductive channel.

One approach for mitigating flicker noise is to implant a noise reducing material into the semiconductor substrate and/or the gate electrode. For example, a noise reducing material may be implanted into a top surface of the gate electrode and/or a top surface of the semiconductor substrate. A first anneal process may be performed on the semiconductor substrate to diffuse the noise reducing material through the gate electrode to an interface between the gate dielectric layer and the selectively-conductive channel and to diffuse along the STI corners. The noise reducing material is configured to reduce flicker noise by bonding to dangling bonds that are present at the defects states. However, manufacturing of the MOSFET uses one or more subsequent anneal processes (e.g., a source/drain regions anneal) that may cause the noise reducing material to outgas through the gate electrode and/or the semiconductor substrate. Due to the outgas sing of the noise reducing material, the effectiveness of the noise reducing material to reduce the flicker noise that affects the MOSFET is decreased.

Therefore, the present disclosure is directed to a method of forming a MOSFET having an outgas prevention layer disposed over a gate electrode and/or portions of a semiconductor substrate to prevent noise reducing material from outgassing during one or more subsequent anneal processes (e.g., a source/drain regions anneal). The outgas prevention layer acts as a capping layer that prevents the noise reducing material from exuding through the gate and/or semiconductor substrate and releasing to the surrounding environment. Thus, when a subsequent anneal process is performed, the outgas prevention layer may prevent the amount of noise reducing material that outgasses from the MOSFET. In some embodiments, forming the outgas prevention layer may be incorporated into process steps that may already be used (e.g., a resist protective oxide (RPO) layer) to form other features of the MOSFET (e.g., silicided source/drain regions). Accordingly, the outgas prevention layer may increase device performance of MOSFETs by reducing the amount of flicker noise that affects a MOSFET.

Figure 1:
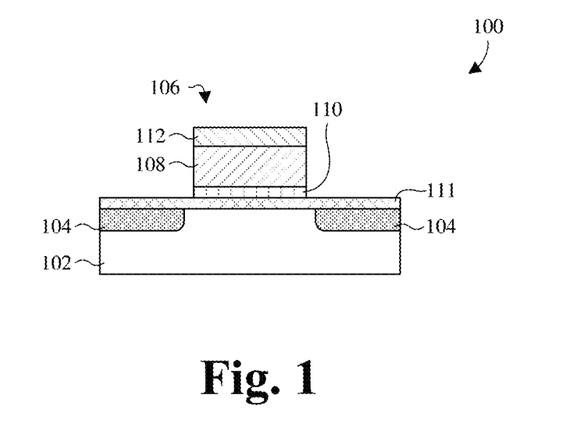
FIG. 1 illustrates a cross-sectional view of some embodiments of a metal-oxide-semiconductor field-effect transistor (MOSFET) having an outgas prevention layer.

FIG. 1 illustrates a cross-sectional view of some embodiments of a metal-oxide-semiconductor field-effect transistor (MOSFET) 100 having an outgas prevention layer.

The MOSFET 100 comprises a pair of source/drain regions 104 disposed within a semiconductor substrate 102. The source/drain regions 104 are laterally spaced from one another. In some embodiments, the source/drain regions 104 may comprise a first doping type (e.g., n-type doping).

A gate stack 106 is disposed over the semiconductor substrate 102 and arranged between the source/drain regions 104. The gate stack 106 comprises a conductive gate electrode 108 separated from the semiconductor substrate 102 by a gate dielectric layer 110.

A noise reducing material 111 is disposed near an upper surface of the semiconductor substrate 102. In some embodiments, the noise reducing material 111 is disposed near an interface of the gate dielectric layer 110 and the semiconductor substrate 102. In further embodiments, the noise reducing material 111 is disposed in the source/drain regions 104 near an upper surface of the semiconductor substrate 102. Although the noise reducing material 111 is illustrated as being within the semiconductor substrate 102, it will be appreciated that the noise reducing material 111 may also be within the gate stack 106 (e.g., within the conductive gate electrode 108). In yet further embodiments, the noise reducing material 111 may comprise fluorine (F), chlorine (Cl), hydrogen ($H_2$), deuterium ($^2H$), or the like.

A patterned outgas prevention layer 112 is disposed over the gate stack 106. In some embodiments, the patterned outgas prevention layer 112 has sidewalls that substantially align with sidewalls of the gate stack 106. In further embodiments, the patterned outgas prevention layer 112 may extend along sides of the gate stack 106 and over the source/drain regions 104. In yet further embodiments, the patterned outgas prevention layer 112 may comprise silicon nitride, a silicon dioxide ($SiO_2$), silicon oxy-nitride (e.g., SiON), or the like. In yet further embodiments, the patterned outgas prevention layer 112 may be considered a cap layer.

After the patterned outgas prevention layer 112 is formed over the gate stack 106, one or more subsequent anneal processes (e.g., a source/drain regions anneal) may be used to complete formation of the MOSFET 100. By forming the patterned outgas prevention layer 112 over the gate stack 106, the patterned outgas prevention layer 112 may prevent the noise reducing material 111 from exuding through the gate stack 106 and being released to the surrounding environment during the one or more subsequent anneal processes. Thus, the amount of flicker noise that affects the MOSFET 100 may be reduced by increasing the amount of noise reducing material 111 that is present in the MOSFET 100 after the one or more subsequent anneal processes. In addition, in some embodiments, formation of the patterned outgas prevention layer 112 may be incorporated into process steps that may already be used (e.g., a resist protective oxide (RPO) layer) to form other features of the MOSFET 100 (e.g., silicided source/drain regions). Accordingly, the patterned outgas prevention layer 112 may increase device performance without increasing the cost to manufacture the MOSFET 100 by reducing the amount of flicker noise that affects the MOSFET 100.

Figure 2:
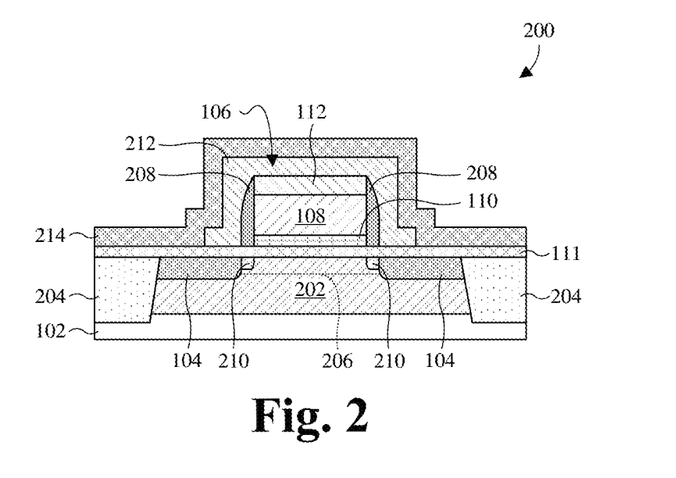
FIG. 2 illustrates a cross-sectional view of some more detailed embodiments of a MOSFET having an outgas prevention layer.

FIG. 2 illustrates a cross-sectional view of some more detailed embodiments of a MOSFET 200 having an outgas prevention layer.

The MOSFET 200 comprises a well 202 disposed in the semiconductor substrate 102. The well 202 may have a first doping type (e.g., p-type doping). The semiconductor substrate 102 may comprise any type of semiconductor body (e.g., monocrystalline silicon/CMOS bulk, silicon-germanium (SiGe), silicon on insulator (SOI), etc.).

An isolation structure 204 may be disposed within the semiconductor substrate 102 and surround the well 202. The isolation structure 204 may be a shallow trench isolation (STI) region or a deep trench isolation (DTI) region. In further embodiments, the isolation structure 204 may have a ring-shaped layout that demarcates sides of the well 202.

A pair of source/drain regions 104 are disposed within the semiconductor substrate 102. The source/drain regions 104 are laterally spaced from one another by a selectively-conductive channel 206. The selectively-conductive channel 206 is defined as a portion of the well 202 that laterally extends from one of the source/drain regions 104 to another one of the source/drain regions 104 along a top surface of the semiconductor substrate 102. In some embodiments, the source/drain regions 104 may comprise a second doping type (e.g., n-type doping) different than the first doping type.

A gate stack 106 is disposed over the semiconductor substrate 102 and arranged between the source/drain regions 104. The gate stack 106 comprises a conductive gate electrode 108 separated from the semiconductor substrate 102 by a gate dielectric layer 110. In some embodiments, sidewall spacers 208 are arranged along opposing sides of the gate stack 106, such that sides of the conductive gate electrode 108 and sides of the gate dielectric layer 110 contact the sidewall spacers 208.

In some embodiments, the conductive gate electrode 108 comprises polysilicon. In such embodiments, the gate dielectric layer 110 may comprise a dielectric material, such as an oxide (e.g., $SiO_2$), a nitride (e.g., silicon nitride), or the like. In other embodiments, the conductive gate electrode 108 may comprise a metal, such as aluminum, copper, titanium, tantalum, tungsten, molybdenum, cobalt, or the like. In such embodiments, the gate dielectric layer 110 may comprise a high-k dielectric material, such as hafnium oxide, hafnium silicon oxide, hafnium tantalum oxide, aluminum oxide, zirconium oxide, or the like. In some embodiments, the sidewall spacers 208 may comprise an oxide, a nitride, a carbide, or the like.

A pair of lightly-doped source/drain extensions 210 are disposed within the semiconductor substrate 102 and extend below the sidewall spacers 208. The lightly-doped source/drain extensions 210 are laterally spaced apart and respectively contact the source/drain regions 104. In some embodiments, the lightly-doped source/drain extensions 210 comprise the second doping type (e.g., n-type doping). In yet further embodiments, the lightly-doped source/drain extensions 210 have a different doping concentration than the source/drain regions 104.

A noise reducing material 111 is disposed near an upper surface of the semiconductor substrate 102. In some embodiments, the noise reducing material 111 is disposed near an interface of the gate dielectric layer 110 and the semiconductor substrate 102. In further embodiments, the noise reducing material 111 is disposed in the source/drain regions 104 near an upper surface of the semiconductor substrate 102. In yet further embodiments, the noise reducing material 111 may be disposed in the lightly-doped source/drain extensions 210 near the upper surface of the semiconductor substrate 102 and/or in the isolation structure 204 near the upper surface of the semiconductor substrate 102. The noise reducing material 111 may comprise fluorine (F), chlorine (Cl), hydrogen ($H_2$), deuterium ($^2H$), or the like.

A patterned outgas prevention layer 112 is disposed over the gate stack 106. In some embodiments, a bottommost surface of the patterned outgas prevention layer 112 contacts an uppermost surface of the conductive gate electrode 108. In various embodiments, the patterned outgas prevention layer 112 has sidewalls that substantially align with sidewalls of the gate stack 106. In further embodiments, the sidewall spacers 208 may contact opposing sides of the patterned outgas prevention layer 112. In yet further embodiments, the uppermost surface of the patterned outgas prevention layer 112 may be substantially aligned with an uppermost portion of the sidewall spacers 208. The outgas prevention layer may comprise silicon nitride, a silicon dioxide ($SiO_2$), silicon oxy-nitride (e.g., SiON), or the like.

A resist protective oxide (RPO) layer 212 may be disposed over the patterned outgas prevention layer 112 and along sidewall spacers 208 to an upper surface of the semiconductor substrate 102. In some embodiments, a first bottom surface of the RPO layer 212 contacts an upper surface of the patterned outgas prevention layer 112, and a second bottom surface of the RPO layer 212 contacts an upper surface of the semiconductor substrate 102. In further embodiments, the RPO layer 212 laterally extends along an upper surface of the semiconductor substrate 102 to cover a portion of the source/drain regions 104. In such embodiments, the RPO layer 212 may laterally extend from the sidewall spacers 208 by a distance greater than or equal to about micron 0.2 (μm).

In some embodiments, the RPO layer 212 may laterally extend along the upper surface of the semiconductor substrate 102 and cover a portion of the isolation structure 204. In such embodiments, the RPO layer 212 may laterally extend beyond the source/drain regions 104 to cover the isolation structure 204 by a distance greater than or equal to about 0.2 μm. In other embodiments, the RPO layer 212 is optional. The RPO layer 212 may comprise silicon nitride, a silicon dioxide ($SiO_2$), silicon oxy-nitride (e.g., SiON), or the like.

A contact etch stop layer (CESL) 214 is disposed over the RPO layer 212 and laterally extends over the source/drain regions 104 and the isolation structure 204. In some embodiments, a first bottom surface of the CESL 214 contacts an upper surface of the RPO layer 212, and a second bottom surface of the CESL 214 contacts an upper surface of the semiconductor substrate 102. In further embodiments, the CESL 214 is a conformal layer that completely covers the MOSFET 200. In various embodiments, the CESL may comprise an oxide (e.g., $SiO_2$), a nitride (e.g., silicon nitride), a carbide (e.g., silicon carbide), or the like.

Figure 3A:
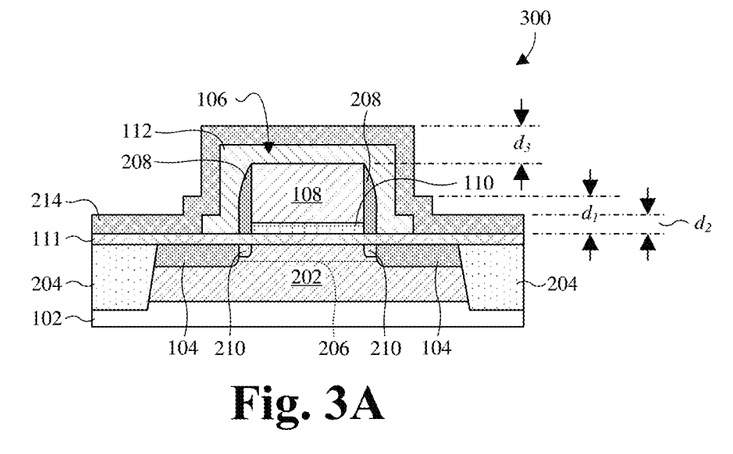
FIGS. 3A-3B illustrate various views of some other more detailed embodiments of a MOSFET having an outgas prevention layer.
Figure 3B:
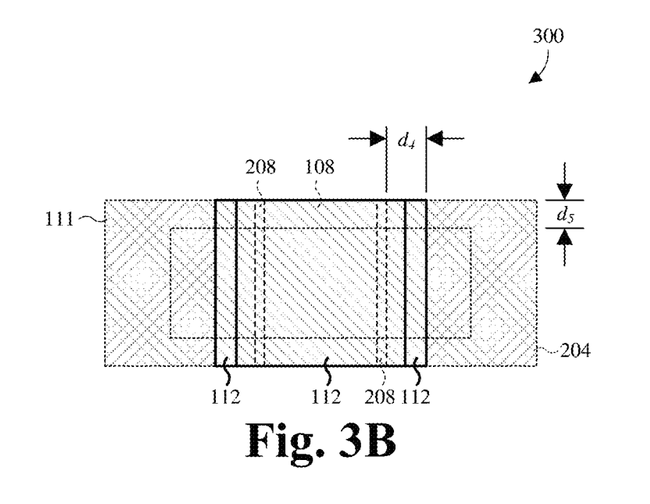

FIGS. 3A-3B illustrate various views of some other more detailed embodiments of a MOSFET having an outgas prevention layer. FIG. 3A is a cross-sectional view of the MOSFET having an outgas prevention layer. FIG. 3B is a top view of the MOSFET having an outgas prevention layer.

A MOSFET 300 may comprise a patterned outgas prevention layer 112 that is disposed over the gate stack 106 and extends along sidewall spacers 208 to an upper surface of the semiconductor substrate 102. In some embodiments, the patterned outgas prevention layer 112 may laterally extend over the source/drain regions 104 and the isolation structure 204. In various embodiments, the patterned outgas prevention layer 112 may be formed via a same process that forms an RPO layer 212 in other regions of an integrated circuit (IC). In further embodiments, a CESL 214 is disposed over the patterned outgas prevention layer 112 and laterally extends over the source/drain regions 104 and the isolation structure 204. In yet further embodiments, a bottom surface of the CESL 214 contacts an upper surface of the patterned outgas prevention layer 112.

As shown in the cross-sectional view of FIG. 3A, the CESL 214 may have a first upper surface, a second upper surface, and a third upper surface. The first surface is disposed over the second upper surface, and both the first upper surface and the second upper surface are arranged between a top surface of the gate stack 106 and a top surface of the semiconductor substrate 102. The third upper surface is disposed over both the first upper surface and the second upper surface and is arranged over the top surface of the gate stack 106. In some embodiments, the first upper surface of the CESL 214 is a first distance, $d_1$, from an uppermost surface of the semiconductor substrate 102. In further embodiments, the second upper surface of the CESL 214 is a second distance, $d_2$, less than the first distance, $d_1$, from the uppermost surface of the semiconductor substrate 102. In yet further embodiments, the third upper surface of the CESL 214 is a third distance, $d_3$, substantially the same as the first distance, $d_1$, from the top surface of the gate stack 106.

As shown in the top-view of FIG. 3B, the patterned outgas prevention layer 112 may laterally extend along a first axis a fourth distance, $d_4$, beyond outer sidewalls of the sidewall spacers 208. In some embodiments, the patterned outgas prevention layer 112 may laterally extend along a second axis perpendicular to the first axis a fifth distance, $d_5$, over the isolation structure 204. In further embodiments, the fourth distance, $d_4$, is greater than or equal to about 0.2 micron (μm), and the fifth distance, $d_5$, is greater than or equal to about 0.2 μm. In yet further embodiments, the fourth distance, $d_4$, and the fifth distance, $d_5$, are substantially the same. In other embodiments, the fourth distance, $d_4$, and the fifth distance, $d_5$, are different. By extending the patterned outgas prevention layer 112 beyond outer sidewalls of the sidewall spacers 208 and over the isolation structure 204, the patterned outgas prevention layer 112 reduces the amount of noise reducing material 111 that outgasses through the MOSFET 300. Accordingly, the performance of the MOSFET 300 may be improved by reducing the amount of flicker noise that affects the MOSFET 300.

Figure 4A:
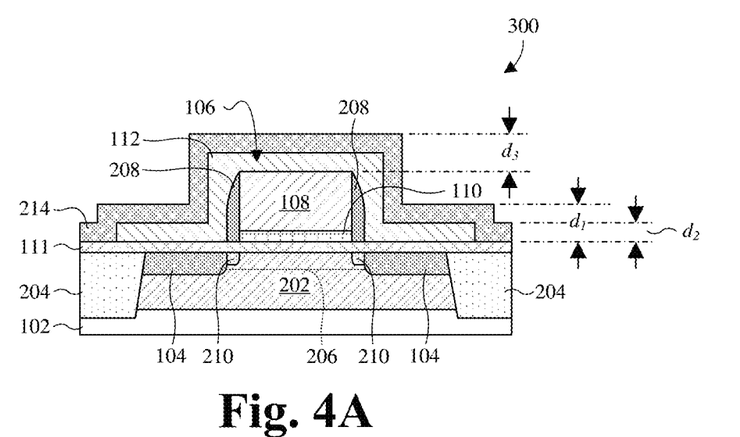
FIGS. 4A-4B illustrate some other embodiments of the MOSFET of FIG. 3A-3B.
Figure 4B:
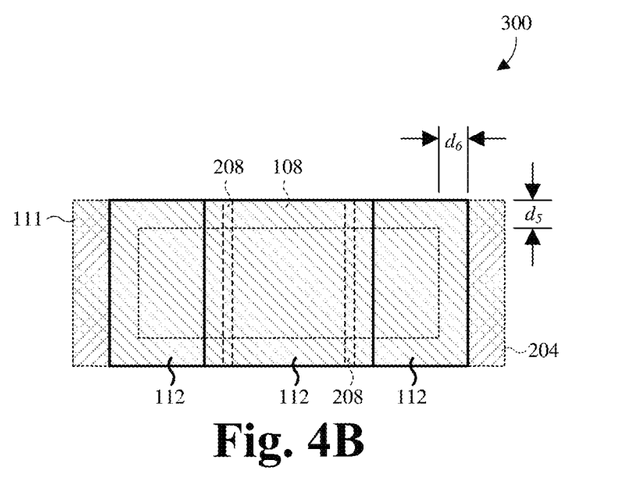

FIGS. 4A-4B illustrate some other embodiments of the MOSFET of FIGS. 3A-3B. FIG. 4A is a cross-sectional view of the MOSFET having an outgas prevention layer. FIG. 4B is a top view of the MOSFET having an outgas prevention layer.

As shown in FIGS. 4A-4B, the patterned outgas prevention layer 112 extends partially over the isolation structure 204. In some embodiments, the patterned outgas prevention layer 112 extends in the first lateral direction to overlap the isolation structure 204 by a sixth distance, $d_6$. In further embodiments, the sixth distance, $d_6$, is greater than or equal to about 0.2 μm. In yet further embodiments, the sixth distance, $d_6$, and the fifth distance, $d_5$, are substantially the same. In other embodiments, the sixth distance, $d_6$, and the fifth distance, $d_5$, are different.

FIGS. 5-19 illustrate a series of cross-sectional views of some embodiments for forming a MOSFET having an outgas prevention layer. Although FIGS. 5-19 are described in relation to a method, it will be appreciated that the structures disclosed in FIGS. 5-19 are not limited to such a method, but instead may stand alone as structures independent of the method.

Figure 5:
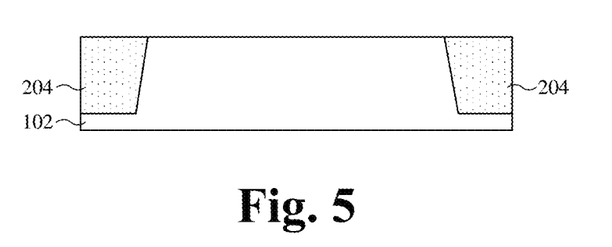
FIGS. 5-19 illustrate a series of cross-sectional views of some embodiments for forming a MOSFET having an outgas prevention layer.

As illustrated by FIG. 5, an isolation structure 204 is formed within a semiconductor substrate 102. In some embodiments, the isolation structure 204 may be formed by selectively etching the semiconductor substrate 102 to form a trench in the semiconductor substrate 102, and subsequently filing the trench with a dielectric material. In further embodiments, the semiconductor substrate 102 is selectively etched by forming a masking layer (not shown) over the semiconductor substrate 102, and subsequently exposing the semiconductor substrate 102 to an etchant configured to selectively remove unmasked portions of the semiconductor substrate 102. In yet further embodiments, the dielectric material may comprise an oxide (e.g., silicon oxide), a nitride, a carbide, or the like.

Figure 6:
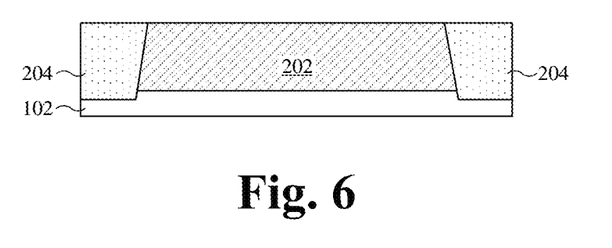

As illustrated by FIG. 6, a well 202 is formed within the semiconductor substrate 102. The well 202 is a region of the semiconductor substrate 102 having a first doping type (e.g. p-type doping). In some embodiments, the well 202 has a doping type opposite that of adjoining regions of the semiconductor substrate 102. In various embodiments, the well 202 may be formed by an ion implantation process and may utilize a masking layer (not shown) to selectively implant ions into the semiconductor substrate 102.

Figure 7:
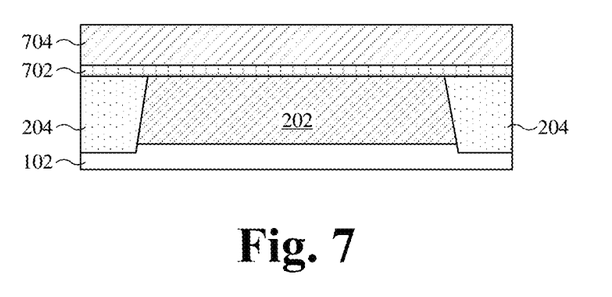

As illustrated by FIG. 7, a dielectric layer 702 and a conductive layer 704 are formed over the isolation structure 204 and the well 202, such that the dielectric layer 702 separates the conductive layer 704 from the semiconductor substrate 102. In some embodiments, the dielectric layer 702 may be silicon dioxide, a high-k dielectric, or some other dielectric. In further embodiments, the conductive layer 704 may be doped polysilicon, metal, or some other conductor. In other embodiments, the conductive layer 704 may be polysilicon that undergoes a subsequent doping process (e.g., ion implantation).

In some embodiments, a process for forming the dielectric layer 702 and the conductive layer 704 comprises depositing or growing the dielectric layer 702 on the isolation structure 204 and the well 202 of the semiconductor substrate 102, and subsequently depositing or growing the conductive layer 704 on the dielectric layer 702. In further embodiments, the dielectric layer 702 may be deposited or grown by thermal oxidation, chemical vapor deposition (CVD), physical vapor deposition (PVD), atomic layer deposition (ALD), sputtering, or some other deposition or growth process. In yet further embodiments, the conductive layer 704 may be deposited or grown by CVD, PVD, ALD, sputtering, electrochemical plating, electroless plating, or some other deposition or growth process.

Figure 8:
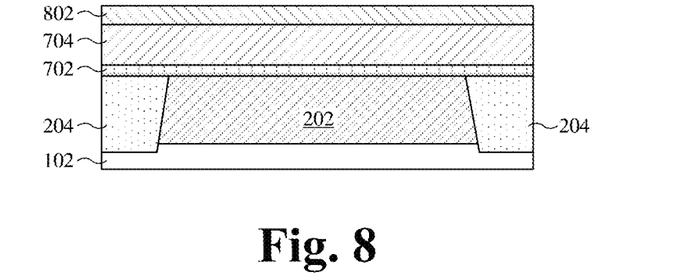

As illustrated by FIG. 8, an outgas prevention layer 802 is formed over the conductive layer 704. In some embodiments, the outgas prevention layer 802 may comprise silicon nitride, a silicon dioxide ($SiO_2$), silicon oxy-nitride (e.g., SiON), or the like. In further embodiments, the outgas prevention layer 802 may be deposited or grown on the conductive layer 704 by thermal oxidation, CVD, PVD, ALD, sputtering, or some other deposition or growth process.

Figure 9:
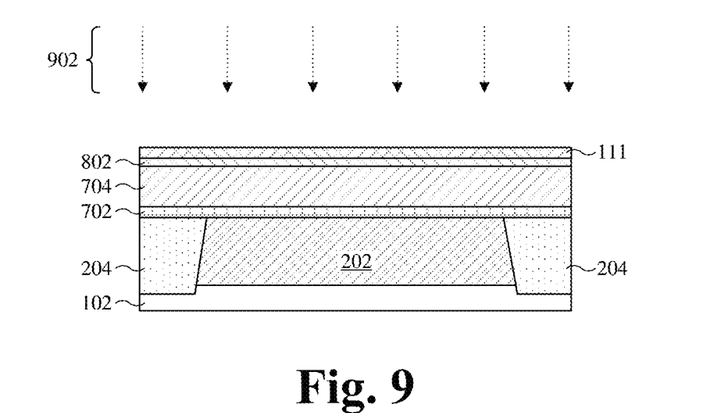

As illustrated by FIG. 9, a noise reducing material 111 is formed over the semiconductor substrate 102. In some embodiments, the noise reducing material 111 may be formed by selectively implanting a dopant species 902 into the outgas prevention layer 802. In various embodiments, the dopant species 902 may comprise fluorine (F), chlorine (Cl), hydrogen ($H_2$), deuterium ($^2H$), or the like. In other embodiments, the noise reducing material 111 may be formed by selectively implanting the dopant species 902 into the conductive layer 704. In such embodiments, the outgas prevention layer 802 is formed after the dopant species 902 is implanted into the conductive layer 704. In further embodiments, the noise reducing material 111 may be formed prior to forming the dielectric layer 702, the conductive layer 704, and/or the outgas prevention layer 802. In such embodiments, the noise reducing material 111 is formed on an upper surface of the semiconductor substrate 102.

Figure 10:
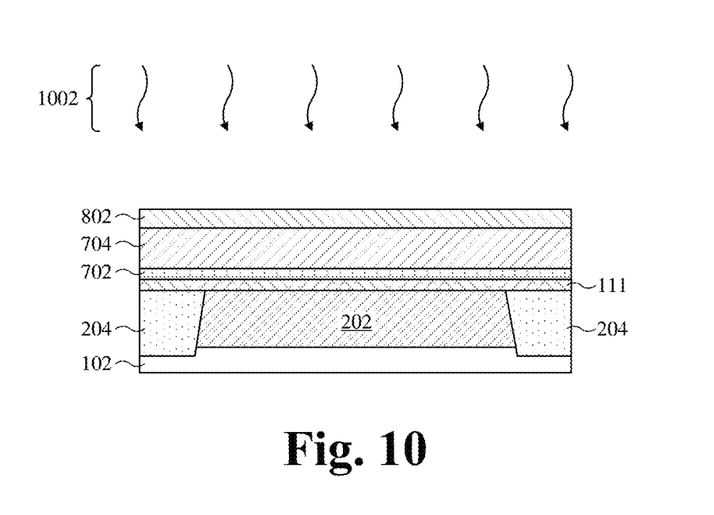

As illustrated by FIG. 10, after the noise reducing material 111 is implanted into the outgas prevention layer 802, a first anneal 1002 is performed on the semiconductor substrate 102. The first anneal 1002 is configured to diffuse the noise reducing material 111 to an upper region of the semiconductor substrate 102. For example, the noise reducing material 111 may diffuse to an interface between the dielectric layer 702 and the well 202, an interface between the isolation structure 204 and the dielectric layer 702, and/or at a corner of the isolation structure 204 and the well 202 disposed near an upper surface of the semiconductor substrate 102. Although the noise reducing material 111 is illustrated as being within the semiconductor substrate 102, it will be appreciated that the noise reducing material 111 may also be within the dielectric layer 702 and/or the conductive layer 704. In yet further embodiments, some of the noise reducing material 111 is disposed in the dielectric layer 702 and some of the noise reducing material is disposed in the semiconductor substrate 102. In various embodiments, the first anneal 1002 may be performed at about 750° C., and the first anneal 1002 may be performed for about two to four hours.

Figure 11:
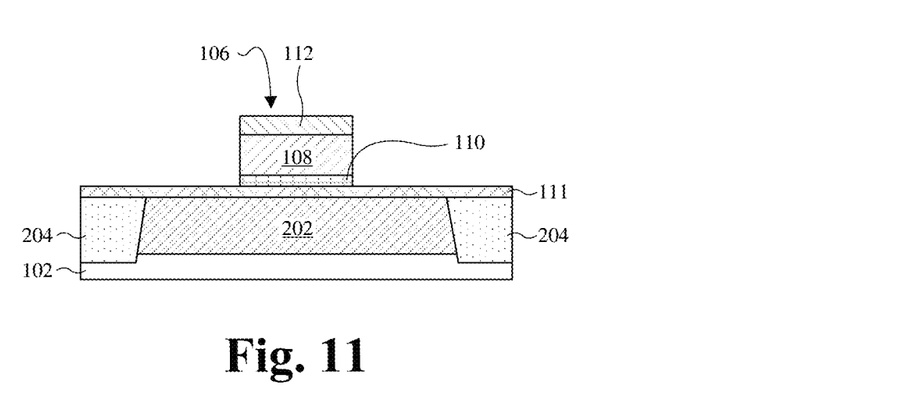

As illustrated by FIG. 11, the conductive layer 704 and the dielectric layer 702 are patterned into a gate stack 106, and the outgas prevention layer 802 is patterned into a patterned outgas prevention layer 112. The gate stack 106 comprises a conductive gate electrode 108 separated from the semiconductor substrate 102 by a gate dielectric layer 110. In some embodiments, the conductive layer 704 and the dielectric layer 702 can be patterned prior to the outgas prevention layer 802 being formed and/or the noise reducing material 111 being implanted.

In some embodiments, a process for patterning the conductive layer 704, the dielectric layer 702, and the outgas prevention layer 802 comprises forming a patterned masking layer (not shown) on the outgas prevention layer 802. In various embodiments, the patterned masking layer may be formed by a spin on process and patterned using photolithography. In further embodiments, the process comprises performing an etch into the outgas prevention layer 802, the conductive layer 704, and the dielectric layer 702 with the patterned masking layer in place, and subsequently stripping the patterned masking layer. In yet further embodiments, the conductive layer 704, the dielectric layer 702, and the outgas prevention layer 802 are patterned by a single patterning process. In other embodiments, a first patterning process is performed to pattern the outgas prevention layer 802 and a second patterning process is performed to pattern the conductive layer 704 and the dielectric layer 702.

Figure 12:
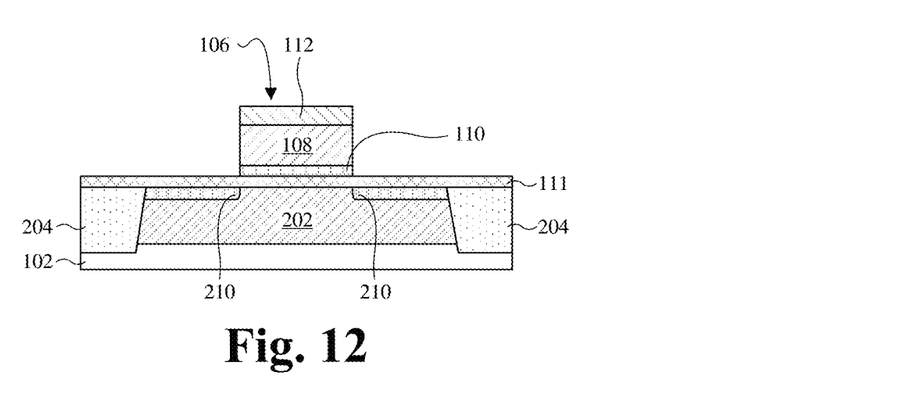

As illustrated by FIG. 12, a pair of lightly-doped source/drain extensions 210 are formed in the well 202. In some embodiments, the lightly-doped source/drain extensions 210 comprise a second doping type (e.g., n-type doping) that is different than the first doping type (e.g., p-type doping). In various embodiments, the pair of lightly-doped source/drain extensions 210 may be formed by an ion implantation process and may utilize a masking layer (not shown) to selectively implant ions into the semiconductor substrate 102. In yet further embodiments, the noise reducing material 111 may be implanted into the gate stack 106, the patterned outgas prevention layer 112, and the semiconductor substrate 102 during formation of the lightly-doped source/drain extensions 210.

Figure 13:
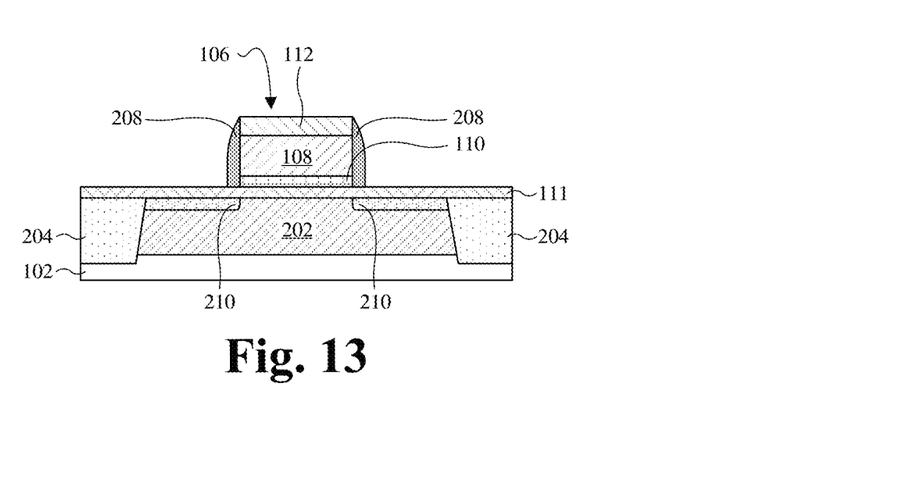

As illustrated by FIG. 13, sidewall spacers 208 are formed over the semiconductor substrate 102 and along sides of the gate stack 106 and the patterned outgas prevention layer 112. In some embodiments, the sidewall spacers 208 may be formed by depositing a spacer layer over the semiconductor substrate 102, the gate stack 106, and the patterned outgas prevention layer 112. In further embodiments, the spacer layer may be deposited by PVD, CVD, ALD, sputtering, or some other deposition process. In yet further embodiments, the spacer layer is subsequently etched to remove the spacer layer from horizontal surfaces, leaving the spacer layer along opposing sides of gate stack 106 and the patterned outgas prevention layer 112, as the sidewall spacers 208. In various embodiments, the spacer layer may comprise silicon nitride, a silicon dioxide (SiO$_2$), silicon oxy-nitride (e.g., SiON), or the like. In some embodiments, the sidewall spacers 208 may be formed prior to forming the lightly-doped source/drain extensions 210. In such embodiments, the lightly-doped source/drain extensions 210 may be formed using an angled implantation process.

Figure 14:
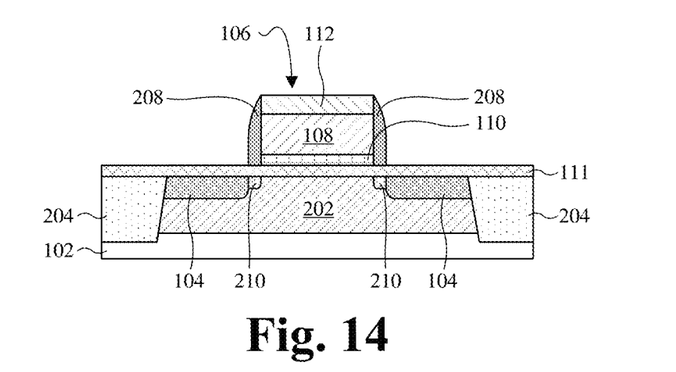

As illustrated by FIG. 14, a pair of source/drain regions 104 are formed within the well 202. In some embodiments, the pair of source/drain regions 104 comprise the second doping type (e.g., n-type doping). In further embodiments, the source/drain regions 104 respectively adjoin the lightly-doped source/drain extensions 210. In yet further embodiments, the source/drain regions 104 have a different doping concentration than the lightly-doped source/drain extensions 210. In various embodiments, the source/drain regions 104 may be formed by an ion implantation process and may utilize a masking layer (not shown) to selectively implant ions into the semiconductor substrate 102. In yet further embodiments, the noise reducing material 111 may be implanted into the gate stack 106, the patterned outgas prevention layer 112, and the semiconductor substrate 102 during formation of the source/drain regions 104.

Figure 15:
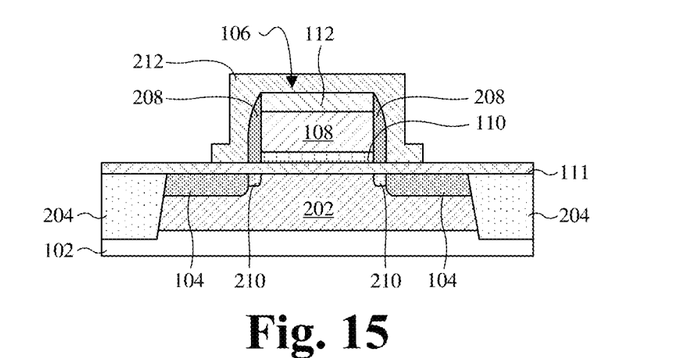

As illustrated by FIG. 15, a resist protective oxide (RPO) layer 212 is formed over the patterned outgas prevention layer 112 and the semiconductor substrate 102 and along the sidewall spacers 208. In some embodiments, the RPO layer 212 may comprise silicon nitride, a silicon dioxide (SiO$_2$), silicon oxy-nitride (e.g., SiON), or the like.

In some embodiments, a process for forming the RPO layer 212 may comprise depositing or growing a conformal RPO layer (not shown) over the gate stack 106, the sidewall spacers 208, and the semiconductor substrate 102. The conformal RPO layer may be deposited or grown by thermal oxidation, CVD, PVD, ALD, sputtering, or some other deposition or growth process. In various embodiments, a patterned masking layer is formed over the conformal RPO layer by a spin on process and patterned using photolithography. In further embodiments, an etch is performed into the conformal RPO layer with the patterned masking in place, and subsequently stripping the patterned masking layer.

In some embodiments, the RPO layer 212 may be formed such that the patterned outgas prevention layer 112 (or a portion of the patterned outgas prevention layer 112) is not covered by the RPO layer 212. In further embodiments, the RPO layer 212 may be formed over the conductive gate electrode 108 such that a bottom surface of the RPO layer 212 contacts the conductive gate electrode 108. In such an embodiment, the patterned outgas prevention layer 112 may not be formed and the RPO layer 212 may prevent the noise reducing material 111 from outgassing during one or more subsequent anneal processes. In further embodiments, the patterned outgas prevention layer 112, the RPO layer 212, or a combination of the two may prevent the noise reducing material 111 from outgas sing such that a concentration of the noise reducing material 111 near an interface between the gate dielectric layer 110 and the semiconductor substrate 102 is greater than or equal to about $1.0 \times 10^{21}$ cm$^{-3}$. In yet further embodiments, the RPO layer 212 may be used to form other features of the MOSFET (e.g., silicided source/drain regions), which may increase device performance without increasing the cost to manufacture a MOSFET (e.g., by limiting the amount of process steps used to form the MOSFET).

Figure 16:
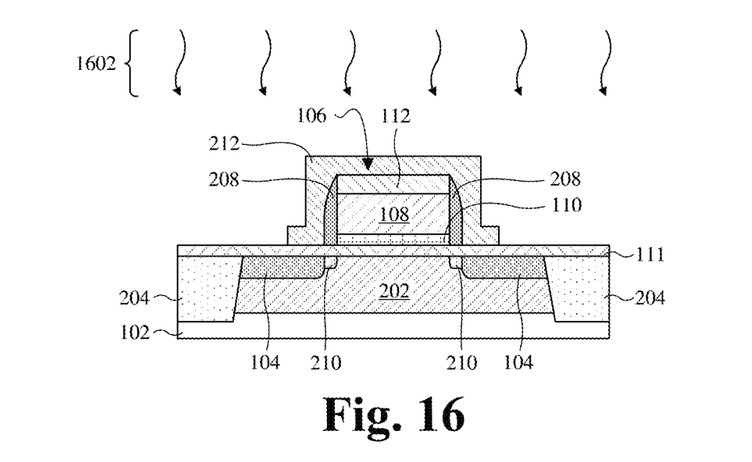

As illustrated by FIG. 16, a second anneal process 1602 is performed on the semiconductor substrate 102. In some embodiments, the second anneal process 1602 is a drive-in anneal process configured to diffuse a dopant species (e.g., phosphorus, arsenic, etc.) of the source/drain regions 104 into the semiconductor substrate 102. During the second anneal process 1602, the noise reducing material 111 may outgas by exuding through the gate stack 106 and/or semiconductor substrate 102 to a surrounding environment. However, by forming the patterned outgas prevention layer 112 over the gate stack (and/or the semiconductor substrate 102), the patterned outgas prevention layer 112 may prevent the amount of noise reducing material 111 that outgasses from the MOSFET.

Figure 17:
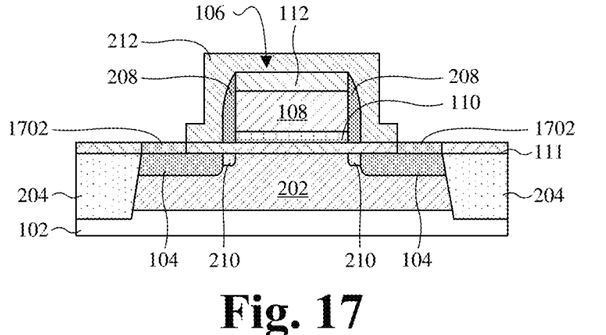

As illustrated by FIG. 17, in some embodiments, silicide layers 1702 are formed on the source/drain regions 104. In some embodiments, an additional silicide layer (not shown) is formed on the conductive gate electrode 108. In various embodiments, the silicide layers 1702 may comprise nickel (e.g., nickel silicide), titanium (e.g., titanium silicide), cobalt (e.g., cobalt silicide), platinum (e.g., platinum silicide), tungsten (e.g., tungsten silicide), or the like.

In some embodiments, a process for forming the silicide layers 1702 comprises depositing a transition metal layer covering the RPO layer 212 and the semiconductor substrate 102, and subsequently heating the transition metal layer so it reacts with exposed silicon to form the silicide layers 1702. In further embodiments, the process comprises removing unreacted material of the transition metal layer (and/or the RPO layer 212) by an etch. In yet further embodiments, the process may be a self-aligned process.

Figure 18:
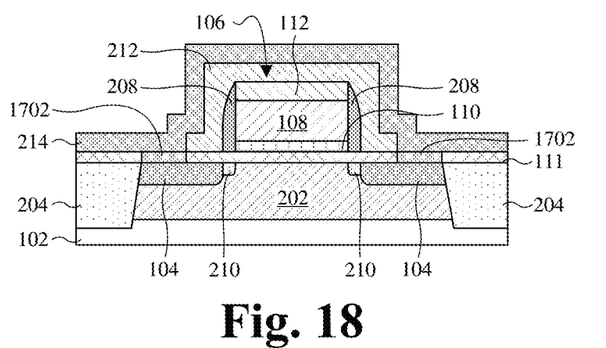

As illustrated by FIG. 18, a contact etch stop layer (CESL) 214 is formed over the RPO layer 212 and the semiconductor substrate 102. In some embodiments, the CESL 214 may comprise silicon nitride, a silicon dioxide ($SiO_2$), silicon oxy-nitride (e.g., SiON), or the like. In further embodiments, the CESL 214 may be deposited or grown on the RPO layer 212 and the semiconductor substrate 102 by thermal oxidation, CVD, PVD, ALD, sputtering, or some other deposition or growth process. In yet further embodiments, the CESL 214 is formed conformally over the RPO layer 212 and the semiconductor substrate 102.

Figure 19:
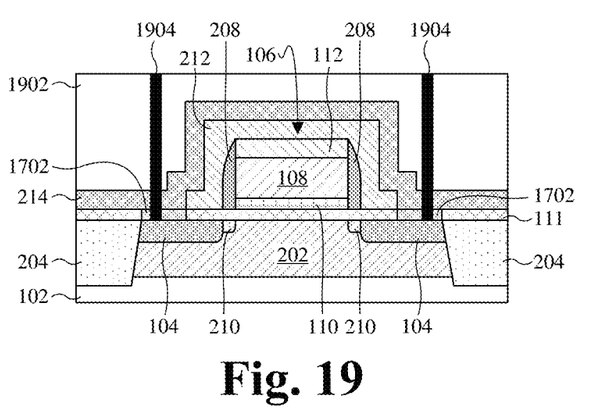

As illustrated by FIG. 19, an interlayer dielectric (ILD) layer 1902 is formed over the CESL 214. The ILD layer 1902 may be formed with a planar upper surface and may comprise an oxide, a nitride, a low-k dielectric, or some other dielectric. In some embodiments, the ILD layer 1902 may be formed by CVD, PVD, sputtering, or some other deposition or growth process. In further embodiments, a planarization process (e.g., a chemical-mechanical planarization (CMP)) may be performed on the ILD layer 1902 to form a substantially planar upper surface.

Also illustrated by FIG. 19, contacts 1904 are formed extending through the ILD layer 1902 and the CESL 214 to the source/drain regions 104 and/or the silicide layers 1702. In some embodiments, a contact 1904 may be formed that extends through the ILD layer 1902 to the conductive gate electrode 108. In yet further embodiments, a silicide layer (not shown) may be formed over the conductive gate electrode 108 and a contact 1904 may extend through the ILD layer 1902 to the silicide layer (not shown).

In some embodiments, a process for forming the contacts 1904 comprises performing an etch into the ILD layer 1902 to form contact openings that correspond to the contacts 1904. In some embodiments, the etch may be performed with a patterned masking layer formed over the ILD layer 1902. In further embodiments, the process comprises filling the contact openings with a conductive material (e.g., tungsten). In yet further embodiments, the contact openings may be filled by depositing or growing a conductive layer covering the ILD layer 1902 that fills the contact openings, and subsequently performing a planarization (e.g., CMP) on the ILD layer 1902.

Although not shown, additional dielectric layers and conductive features may be subsequently formed over the ILD layer 1902. For example, one or more additional ILD layers, wires, vias, and/or passivation layers may be formed over the ILD layer 1902.

Figure 20:
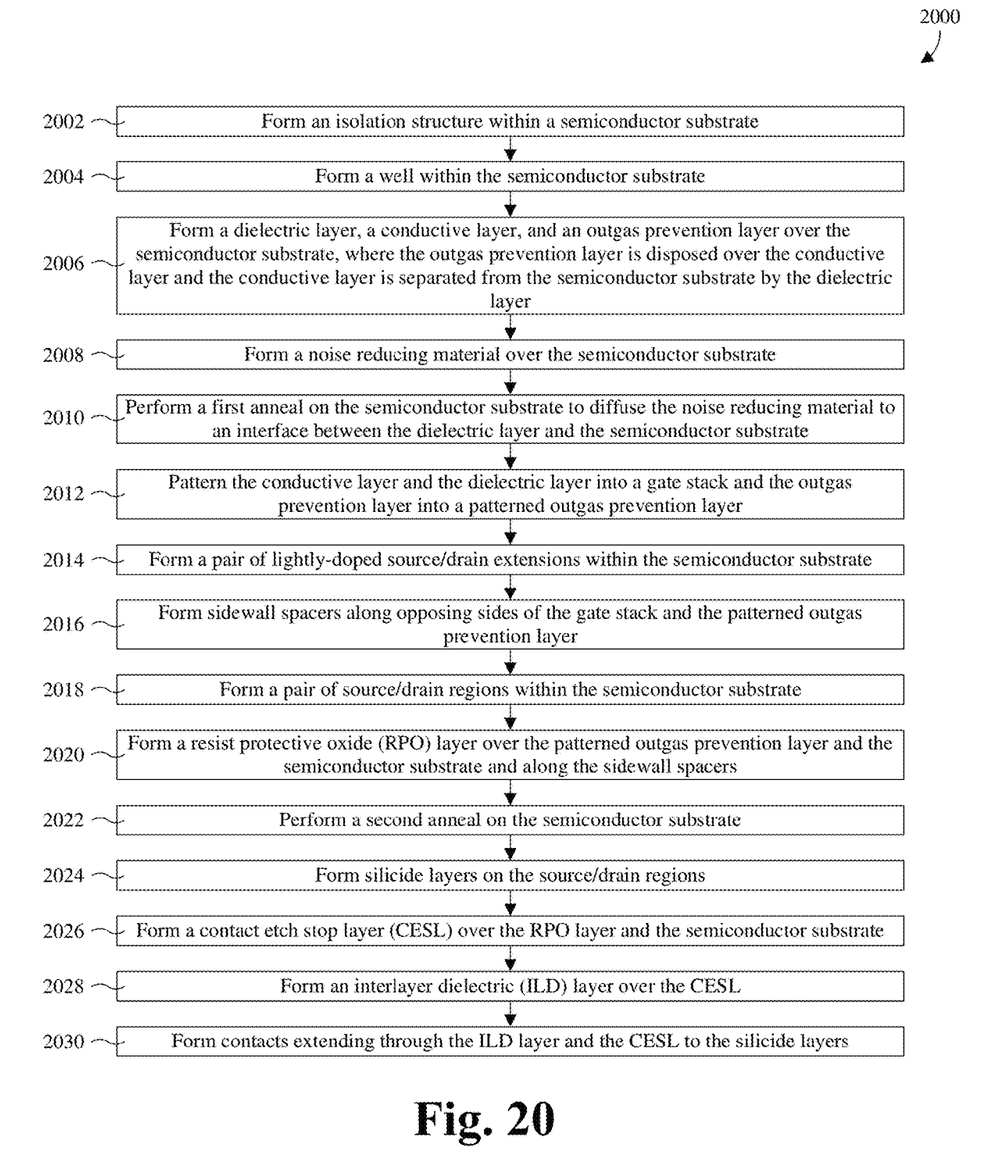
FIG. 20 illustrates a flowchart of some embodiments of a method for forming a MOSFET having an outgas prevention layer.

As illustrated in FIG. 20, a flowchart 2000 of some embodiments of a method for forming a MOSFET having an outgas prevention layer is provided. While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 2002, an isolation structure is formed within the semiconductor substrate. FIG. 5 illustrates a cross-sectional view of some embodiments corresponding to act 2002.

At 2004, a well is formed within the semiconductor substrate. FIG. 6 illustrates a cross-sectional view of some embodiments corresponding to act 2004.

At 2006, a dielectric layer, a conductive layer, and an outgas prevention layer are formed over the semiconductor substrate, where the outgas prevention layer is disposed over the conductive layer and the conductive layer is separated from the semiconductor substrate by the dielectric layer. FIGS. 7-8 illustrate cross-sectional views of some embodiments corresponding to act 2006.

At 2008, a noise reducing material is formed over the semiconductor substrate. FIG. 9 illustrates a cross-sectional view of some embodiments corresponding to act 2008.

At 2010, a first anneal is performed on the semiconductor substrate to diffuse the noise reducing material to an interface between the dielectric layer and the semiconductor substrate. FIG. 10 illustrates a cross-sectional view of some embodiments corresponding to act 2010.

At 2012, the conductive layer and the dielectric layer are patterned into a gate stack, and the outgas prevention layer is patterned into a patterned outgas prevention layer. FIG. 11 illustrates a cross-sectional view of some embodiments corresponding to act 2012.

At 2014, a pair of lightly-doped source/drain extensions are formed within the semiconductor substrate. FIG. 12 illustrates a cross-sectional view of some embodiments corresponding to act 2014.

At 2016, sidewall spacers are formed along opposing sides of the gate stack and the patterned outgas prevention layer. FIG. 13 illustrates a cross-sectional view of some embodiments corresponding to act 2016.

At 2018, a pair of source/drain regions are formed within the semiconductor substrate. FIG. 14 illustrates a cross-sectional view of some embodiments corresponding to act 2018.

At 2020, a resist protective oxide (RPO) layer is formed over the patterned outgas prevention layer and the semiconductor substrate and along the sidewall spacers. FIG. 15 illustrates a cross-sectional view of some embodiments corresponding to act 2020.

At 2022, a second anneal is performed on the semiconductor substrate. FIG. 16 illustrates a cross-sectional view of some embodiments corresponding to act 2022.

At 2024, silicide layers are formed on the source/drain regions. FIG. 17 illustrates a cross-sectional view of some embodiments corresponding to act 2024.

At 2026, a contact etch stop layer (CESL) is formed over the RPO layer and the semiconductor substrate. FIG. 18 illustrates a cross-sectional view of some embodiments corresponding to act 2026.

At 2028, an interlayer dielectric (ILD) layer is formed over the CESL. FIG. 19 illustrates a cross-sectional view of some embodiments corresponding to act 2028.

At 2030, contacts are formed extending through the ILD layer and the CESL to the silicide layers. FIG. 19 illustrates a cross-sectional view of some embodiments corresponding to act 2030.

In some embodiments, the present application provides a semiconductor device. The semiconductor device comprises a source region and a drain region disposed in a semiconductor substrate, where the source region is laterally spaced from the drain region. A gate stack is disposed over the semiconductor substrate and arranged between the source region and the drain region. A cap layer is disposed over the gate stack, where a bottom surface of the cap layer contacts a top surface of the gate stack. Sidewall spacers are disposed along sides of the gate stack and the cap layer. A resist protective oxide (RPO) layer is disposed over the cap layer, wherein the RPO layer extends along sides of the sidewall spacers to the semiconductor substrate. A contact etch stop layer (CESL) is disposed over the RPO layer, the source region, and the drain region.

In other embodiments, the present application provides a method for forming a semiconductor device. The method comprises forming a gate stack over a semiconductor substrate. A cap layer is formed over the gate stack. A noise reducing material is implanted into the gate stack. A source region and a drain region are formed in the semiconductor substrate, where the source region is laterally spaced from the drain region by the gate stack. A first anneal process is performed on the semiconductor substrate, where the cap layer is configured to prevent the noise reducing material from outgassing during the first anneal process.

In yet other embodiments, the present application provides a semiconductor device. The semiconductor device comprises a source region and a drain region disposed in a semiconductor substrate, where the source region is laterally spaced from the drain region. A conductive gate electrode is separated from the semiconductor substrate by a gate dielectric layer, where the conductive gate electrode and the gate dielectric layer are arranged between the source region and the drain region. A cap layer is disposed on the conductive gate electrode, where the cap layer extends along opposite sides of the conductive gate electrode and opposite sides of the gate dielectric layer to contact a top surface of the semiconductor substrate. A contact etch stop layer (CESL) is disposed over the cap layer, where the CESL extends beyond sidewalls of the cap layer and contacts the top surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   source/drain regions disposed in a semiconductor substrate, wherein the source/drain regions are laterally spaced;
   a gate stack disposed over the semiconductor substrate and disposed between the source/drain regions;
   a cap layer disposed over the gate stack, wherein a first lower surface of the cap layer contacts a first upper surface of the gate stack;
   sidewall spacers disposed along sides of the gate stack;
   a first dielectric layer disposed over the cap layer, wherein the first dielectric layer extends along sides of the sidewall spacers toward the semiconductor substrate; and
   a second dielectric layer disposed over the first dielectric layer and over the source/drain regions.

2. The semiconductor device of claim 1, further comprising:
   a first isolation structure disposed in the semiconductor substrate, wherein a first source/drain region of the source/drain regions is disposed laterally between the first isolation structure and the gate stack, and wherein the first dielectric layer extends laterally over the semiconductor substrate to at least partially cover the first isolation structure.

3. The semiconductor device of claim 2, further comprising:
   a second isolation structure disposed in the semiconductor substrate, wherein a second source/drain region of the source/drain regions is disposed laterally between the second isolation structure and the gate stack, wherein the first source/drain region and the second source/drain region are disposed on opposite sides of the gate stack, and wherein the first dielectric layer extends laterally over the semiconductor substrate to at least partially cover the second isolation structure.

4. The semiconductor device of claim 1, wherein the first dielectric layer partially covers greater than or equal to about 0.2 microns of a first source/drain region of the source/drain regions and partially covers greater than or equal to about 0.2 microns of a second source/drain region of the source/drain regions.

5. The semiconductor device of claim 1, wherein:
   the first dielectric layer conformally lines the cap layer; and
   the second dielectric layer conformally lines the first dielectric layer.

6. The semiconductor device of claim 1, further comprising:
   an interlayer dielectric (ILD) layer disposed over the semiconductor substrate, the gate stack, the cap layer, the sidewall spacers, the first dielectric layer, and the second dielectric layer.

7. The semiconductor device of claim 1, wherein:
   the first dielectric layer is a resist protective oxide (RPO) layer; and
   the second dielectric layer is a contact etch stop layer (CESL).

8. The semiconductor device of claim 1, wherein the first dielectric layer contacts the semiconductor substrate.

9. The semiconductor device of claim 8, wherein the first dielectric layer contacts both the semiconductor substrate and the cap layer.

10. The semiconductor device of claim 9, wherein the second dielectric layer contacts the first dielectric layer.

11. The semiconductor device of claim 10, wherein the second dielectric layer contacts both the first dielectric layer and the semiconductor substrate.

12. A semiconductor device, comprising:
   source/drain regions disposed in a semiconductor substrate, wherein the source/drain regions are laterally spaced;
   a gate stack disposed over the semiconductor substrate and between the source/drain regions;
   sidewall spacers disposed over the semiconductor substrate and along a first sidewall of the gate stack and a second sidewall of the gate stack opposite the first sidewall of the gate stack;
   a cap layer disposed over the gate stack and the semiconductor substrate, wherein the cap layer extends along the sidewall spacers toward the semiconductor substrate on opposite sides of the gate stack, wherein the cap layer comprises a first sidewall disposed on a first side of the gate stack and a second sidewall disposed on the first side of the gate stack, the first sidewall and the second sidewall facing away from the gate stack, and wherein the first sidewall of the cap layer is spaced a first distance from the first sidewall of the gate stack and the second sidewall of the cap layer is spaced from the first sidewall of the gate stack by a second distance that is less than the first distance; and a dielectric layer disposed over the cap layer, wherein the dielectric layer extends laterally beyond the first sidewall of the cap layer.

13. The semiconductor device of claim 12, further comprising:
an isolation structure disposed in the semiconductor substrate, wherein a first source/drain region of the source/drain regions is disposed between the isolation structure and the gate stack, and wherein both the first sidewall of the cap layer and the second sidewall of the cap layer are disposed laterally between the isolation structure and the gate stack.

14. The semiconductor device of claim 12, wherein the first sidewall is below a bottom of the second sidewall.

15. The semiconductor device of claim 12, further comprising:
an interlayer dielectric (ILD) layer disposed over the semiconductor substrate, the gate stack, the sidewall spacers, the cap layer, and the dielectric layer.

16. The semiconductor device of claim 12, wherein:
the dielectric layer has a first upper surface, a second upper surface, and a third upper surface;
the first upper surface of the dielectric layer is disposed over the semiconductor substrate and vertically spaced from the semiconductor substrate by a third distance;
the second upper surface of the dielectric layer is disposed over the first upper surface of the dielectric layer and vertically spaced from the semiconductor substrate by a fourth distance;
the third upper surface of the dielectric layer is disposed over the gate stack and vertically spaced from the semiconductor substrate by a fifth distance;
an upper surface of the gate stack is vertically spaced from the semiconductor substrate by a sixth distance;
the fourth distance is greater than the third distance;
both the third distance and the fourth distance are less than the sixth distance; and
the fifth distance is greater than the sixth distance.

17. A semiconductor device, comprising:
a pair of source/drain regions disposed in a semiconductor substrate, wherein the source/drain regions are laterally spaced;
a gate stack disposed over the semiconductor substrate and disposed between the source/drain regions;
a cap layer disposed over the gate stack, wherein the cap layer extends along opposite sides of the gate stack toward an upper surface of the semiconductor substrate;
a dielectric layer disposed over the cap layer, wherein the dielectric layer extends laterally beyond sidewalls of the cap layer; and
an isolation structure disposed in the semiconductor substrate, wherein the source/drain regions are disposed between the isolation structure and the gate stack, and wherein the cap layer comprises a lateral extension segment that extends laterally over the upper surface of the semiconductor substrate to at least partially cover the isolation structure.

18. The semiconductor device of claim 17, further comprising:
an interlayer dielectric (ILD) layer disposed over the semiconductor substrate, the isolation structure, the gate stack, the cap layer, and the dielectric layer.

19. The semiconductor device of claim 17, further comprising:
sidewall spacers disposed over the semiconductor substrate and along the opposite sides of the gate stack, wherein the sidewall spacers laterally separate the cap layer from the gate stack.

20. The semiconductor device of claim 17, further comprising:
a noise reducing material disposed in the semiconductor substrate, wherein a concentration of the noise reducing material near the upper surface of the semiconductor substrate is greater than or equal to about $1.0 \times 10^{21}$ cm$^{-3}$.

* * * * *